(12) United States Patent
Wang

(10) Patent No.: US 10,720,450 B2
(45) Date of Patent: Jul. 21, 2020

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Honghui Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 190 days.

(21) Appl. No.: 15/569,219

(22) PCT Filed: Apr. 17, 2017

(86) PCT No.: PCT/CN2017/080797
§ 371 (c)(1),
(2) Date: Oct. 25, 2017

(87) PCT Pub. No.: WO2018/040578
PCT Pub. Date: Mar. 8, 2018

(65) Prior Publication Data
US 2018/0294282 A1    Oct. 11, 2018

(30) Foreign Application Priority Data
Sep. 5, 2016    (CN) .......................... 2016 1 0802113

(51) Int. Cl.
*H01L 27/12*    (2006.01)
*G02F 1/1362*    (2006.01)
(Continued)

(52) U.S. Cl.
CPC ...... *H01L 27/124* (2013.01); *G02F 1/136286* (2013.01); *H01L 27/1225* (2013.01);
(Continued)

(58) Field of Classification Search
CPC .............. H01L 27/124; H01L 27/1225; H01L 27/1244; H01L 27/1259; H01L 27/1262;
(Continued)

(56) References Cited

U.S. PATENT DOCUMENTS

2004/0257322 A1* 12/2004 Moon .................. G09G 3/3648
345/87
2007/0008263 A1* 1/2007 Kim .................. G02F 1/134336
345/87

(Continued)

FOREIGN PATENT DOCUMENTS

CN    102135691 A    7/2011
CN    102636927 A    8/2012
(Continued)

OTHER PUBLICATIONS

International Search Report and Written Opinion dated Jul. 24, 2017; PCT/CN2017/080797.
(Continued)

*Primary Examiner* — Brigitte A Paterson

(57) ABSTRACT

An array substrate and a manufacturing method thereof, a display panel and a display device are provided. The array substrate includes: a base substrate; a plurality of gate lines, a plurality of data lines, and a plurality of common electrode lines on the base substrate; the plurality of common electrode lines and the plurality of gate lines are arranged at different layers; the plurality of common electrode lines and the plurality of data lines are arranged at a same layer and parallel to each other; the plurality of gate lines are insulated from and intersected with the plurality of data lines and the (Continued)

plurality of common electrode lines to define a plurality of sub-pixel units.

14 Claims, 3 Drawing Sheets

(51) Int. Cl.
  *G02F 1/1368* (2006.01)
  *G02F 1/1345* (2006.01)
(52) U.S. Cl.
  CPC ...... *H01L 27/1244* (2013.01); *H01L 27/1259* (2013.01); *H01L 27/1262* (2013.01); *G02F 1/1368* (2013.01); *G02F 1/13454* (2013.01); *G02F 2001/136295* (2013.01)
(58) Field of Classification Search
  CPC ............... G02F 1/1368; G02F 1/13454; G02F 1/136286; G02F 2001/136295
  See application file for complete search history.

(56) References Cited

U.S. PATENT DOCUMENTS

| | | | |
|---|---|---|---|
| 2008/0068307 | A1 | 3/2008 | Kawabe |
| 2011/0164019 | A1 | 7/2011 | Son |
| 2012/0007091 | A1* | 1/2012 | Lee ........................ H01L 27/124 257/60 |
| 2014/0070242 | A1 | 3/2014 | Huang et al. |
| 2014/0138718 | A1* | 5/2014 | Liu ........................ H01L 27/124 257/88 |
| 2018/0136528 | A1 | 5/2018 | Xiao et al. |

FOREIGN PATENT DOCUMENTS

| | | |
|---|---|---|
| CN | 102723344 A | 10/2012 |
| CN | 102749775 A | 10/2012 |
| CN | 102929060 A | 2/2013 |
| CN | 103135298 A | 6/2013 |
| CN | 105372891 A | 3/2016 |
| CN | 105629614 A | 6/2016 |
| CN | 106229319 A | 12/2016 |
| KR | 1020040059672 A | 7/2004 |

OTHER PUBLICATIONS

The First Chinese Office Action dated Aug. 1, 2018; Appln. No. 201610802113.2.

The Third Chinese Office Action dated Sep. 20, 2019; Appln. No. 201610802113.2.

* cited by examiner

ARRAY SUBSTRATE AND MANUFACTURING METHOD THEREOF, DISPLAY PANEL AND DISPLAY DEVICE

TECHNICAL FIELD

Embodiments of the present invention relate to an array substrate and a manufacturing method thereof, a display panel and a display device.

BACKGROUND

Manufacturing process of thin film transistor array substrates is complex, in general, the manufacturing process comprises depositing a metal film and a semiconductor film on a base substrate, then forming a required metal pattern (for example, a pattern of gate lines, a pattern of data lines and a pattern of common electrode lines) and a semiconductor pattern (for example, an active layer) by a patterning process. In a case of forming a signal line, a circuit of the signal line needs to be tested. Each of the thin film transistor array substrates comprises a large number of parallel wirings, so that open circuit, short-circuit between films and other undesirable phenomena are prone to be occurred due to photoresist residue, static electricity and metal residues among the parallel wirings.

SUMMARY

At least one embodiment of the present invention provides an array substrate. The array substrate comprises: a base substrate; a plurality of gate lines, a plurality of data lines, and a plurality of common electrode lines which are provided on the base substrate. The plurality of common electrode lines and the plurality of gate lines are arranged at different layers; the plurality of common electrode lines and the plurality of data lines are arranged at a same layer and are parallel to each other; and the plurality of gate lines are insulated from and intersected with the plurality of data lines and the plurality of common electrode lines to define a plurality of sub-pixel units.

For example, in an array substrate provided by at least one embodiment of the present invention, the plurality of data lines comprise first data lines and second data lines which are arranged in parallel between each pair of adjacent columns of sub-pixel units, in each pair of the adjacent columns of sub-pixel units, the sub-pixel units in each odd row are connected to the first data lines, and the sub-pixel units in each even row are connected to the second data lines.

For example, in an array substrate provided by at least one embodiment of the present invention, further comprising a first data bus and a second data bus which are parallel to the gate lines, each first data line being connected to the first data bus, and each second data line being connected to the second data bus.

For example, in an array substrate provided by at least one embodiment of the present invention, the first data bus and the second data bus are arranged at different layers.

For example, in an array substrate provided by at least one embodiment of the present invention, further comprising a common electrode bus arranged at a different layer from the common electrode lines and parallel to the gate lines, each of the common electrode lines being connected to the common electrode bus.

For example, in an array substrate provided by at least one embodiment of the present invention, the common electrode lines are arranged on the gate lines, or under the gate lines.

For example, in an array substrate provided by at least one embodiment of the present invention, further comprising a thin film transistor, a common electrode and a pixel electrode provided in each of the sub-pixel units. A gate electrode of the thin film transistor is connected to the gate lines, a source electrode of the thin film transistor is connected to the data lines, the common electrode is connected to the common electrode lines, and the pixel electrode is connected to a drain electrode of the thin film transistor.

For example, in an array substrate provided by at least one embodiment of the present invention, a semiconductor layer of the thin film transistor is arranged between a layer of the data lines and a layer of the gate lines, and a gate insulating layer is arranged between the semiconductor layer and the layer of the gate lines.

For example, in an array substrate provided by at least one embodiment of the present invention, an insulating layer is arranged on the layer of the data lines, the layer of the gate lines and the semiconductor layer.

For example, in an array substrate provided by at least one embodiment of the present invention, further comprising a plurality of gate drivers, the plurality of gate drivers being arranged at both ends of each of the gate lines.

At least one embodiment of the present invention provides a display panel, comprising any of the array substrates.

At least one embodiment of the present invention provides a display device, comprising the display panel.

At least one embodiment of the present invention provides a manufacturing method of an array substrate, comprising: providing a base substrate; forming gate lines, data lines, and common electrode lines on the base substrate. The common electrode lines and the gate lines are formed at different layers; the common electrode lines and the data lines are formed at a same layer and are parallel to each other; and the gate lines are insulated from and intersected with the data lines and the common electrode lines to define a plurality of sub-pixel units.

For example, in a manufacturing method provided by at least one embodiment of the present invention, the data lines comprise first data lines and second data lines which are arranged in parallel between each pair of adjacent columns of sub-pixel units, in each pair of the adjacent columns of sub-pixel units, the sub-pixel units in each odd row are connected to the first data lines, and the sub-pixel units in each even row are connected to the second data lines.

For example, in a manufacturing method provided by at least one embodiment of the present invention, further comprising: forming a first data bus and a second data bus. Each first data line is connected to the first data bus, each second data line is connected to the second data bus, and both the first data bus and the second data bus are parallel to the gate lines.

For example, in a manufacturing method provided by at least one embodiment of the present invention, the first data bus and the second data bus are formed at different layers.

For example, in a manufacturing method provided by at least one embodiment of the present invention, further comprising forming a common electrode bus. The common electrode bus is arranged at a different layer from the common electrode lines, and is parallel to the gate lines, and each of the common electrode lines is connected to the common electrode bus.

For example, in a manufacturing method provided by at least one embodiment of the present invention, the common electrode lines are arranged on the gate lines, or under the gate lines.

For example, in a manufacturing method provided by at least one embodiment of the present invention, further comprising: forming a thin film transistor, a common electrode, and a pixel electrode in each of the sub-pixel units. A gate electrode of the thin film transistor is connected to one of the gate lines, a source electrode of the thin film transistor is connected to one of the data lines, the common electrode is connected to one of the common electrode lines, and the pixel electrode is connected to a drain electrode of the thin film transistor.

For example, in a manufacturing method provided by at least one embodiment of the present invention, further comprising forming a semiconductor layer of the thin film transistor between a layer of the data lines and a layer of the gate lines, and forming a gate insulating layer between the semiconductor layer and the layer of the gate lines.

BRIEF DESCRIPTION OF THE DRAWINGS

In order to demonstrate clearly technical solutions of the embodiments of the present invention, the accompanying drawings in relevant embodiments of the present invention will be introduced briefly. It is apparent that the drawings may only relate to some embodiments of the disclosure and not intended to limit the present invention.

DETAILED DESCRIPTION

Figure 1:
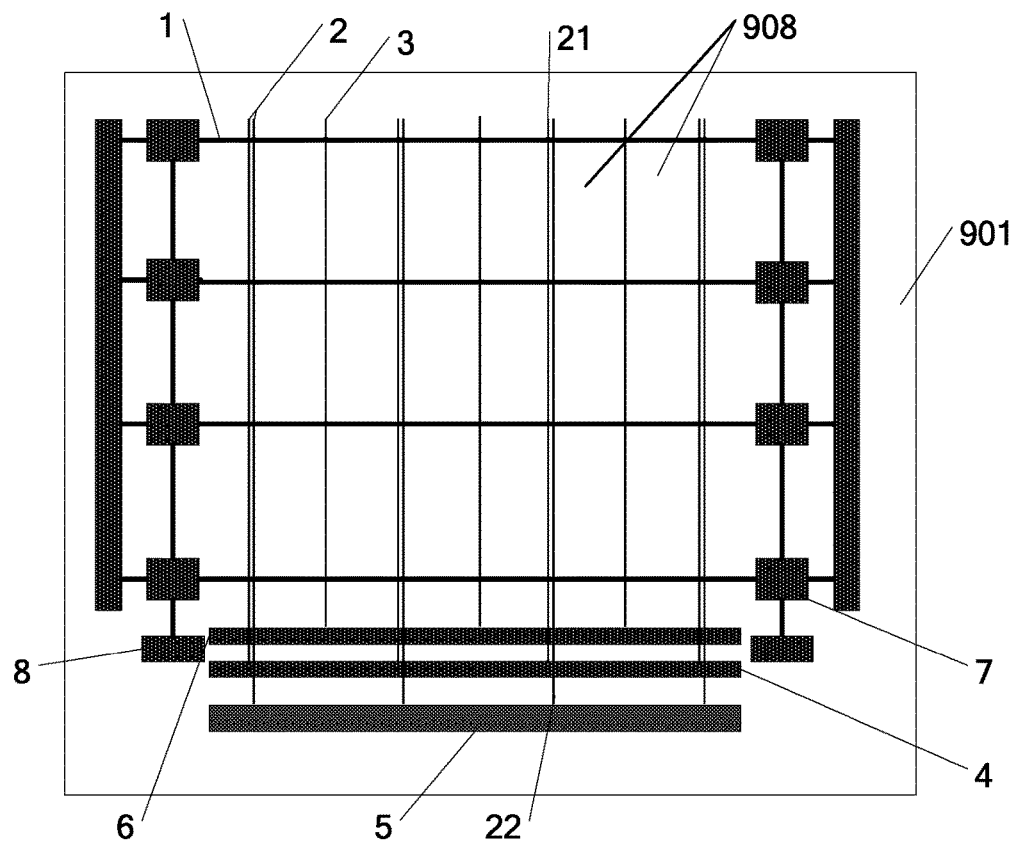
FIG. 1 is a schematic plan view of an array substrate provided by an embodiment of the present invention.

In order to make objects, technical details and advantages of the embodiments of the present invention apparent, the technical solutions of the embodiments will be described in a clearly and fully understandable way in connection with the drawings related to the embodiments of the invention. It is apparent that the described embodiments are just a part but not all of the embodiments of the invention. Based on the described embodiments herein, those skilled in the art can obtain other embodiment(s), without creative work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Currently, phenomena of open circuit, short-circuit between films and so on are prone to be occurred on parallel wirings (for example, gate lines, data lines, or common electrode lines) arranged on thin film transistor array substrates because of residual organic particles, electrostatic and residual metal. Positions of the defective wirings can be detected by line scanning of a line detect sensor (LDS) of a testing equipment firstly, then the specific position coordinates can be detected by scanning the defective wirings by the position detect sensor (PDS).

Currently, in the design of the thin film transistor array substrates, gate lines and common electrode lines are formed in a same process operation, and a space between adjacent signal lines (especially a gate line and a common electrode line adjacent to each other) is small, and the space is usually about 10 μm. A short circuit phenomenon is prone to be occurred between two adjacent signal lines, and accuracy of detection equipment is 28 μm, when the phenomenon of short circuit is occurred, the test equipment is unable to detect the specific position of undesirable phenomena.

At least one embodiment of the present invention provides an array substrate and a manufacturing method thereof, a display panel and a display device. The array substrate comprises: a base substrate; a plurality of gate lines, a plurality of data lines, and a plurality of common electrode lines which are disposed on the base substrate. The plurality of common electrode lines and the plurality of gate lines are arranged at different layers; the plurality of common electrode lines and the plurality of data lines are arranged at a same layer and are parallel to each other; and the plurality of gate lines are insulated from and intersected with the plurality of data lines and the plurality of common electrode lines to define a plurality of sub-pixel units.

In the array substrate, the plurality of common electrode lines and the plurality of gate lines are arranged at different layers, the plurality of common electrode lines are arranged at a same layer as the plurality of data lines, and the plurality of common electrode lines are parallel to the data lines. In this way, it is convenient to test and maintain the circuit of the array substrate, and the detection capability of the device is enhanced, so that the yield of the product is improved.

An embodiment of the present invention provides an array substrate. FIG. 1 is a schematic plan view of an array substrate provided by an embodiment of the present invention, as illustrated in FIG. 1, the array substrate comprises a base substrate 901, and a plurality of gate lines 1 (bold lines as illustrated in FIG. 1) parallel to each other, a plurality of data lines 2 parallel to each other, and a plurality of common electrode lines 3 parallel to each other, which are disposed on the base substrate 901. The plurality of common electrode lines 3 and the plurality of gate lines 1 are arranged at different layers; the plurality of common electrode lines 3 are arranged at a same layer as the plurality of data lines 2, and the plurality of common electrode lines 3 are parallel to the plurality of data lines 2; the plurality of gate lines 1 are insulated from the plurality of data lines 2 and the plurality of common electrode lines 3, and the plurality of gate lines 1 are intersected with plurality of data lines 2 and the plurality of common electrode lines 3 to define a plurality of sub-pixel units 908. In this way, the plurality of sub-pixel units 908 are arranged in an array.

In the array substrate provided by at least one embodiment of the present invention, the plurality of common electrode lines 3 and the plurality of gate lines 1 are arranged at different layers, the plurality of common electrode lines 3 are arranged at a same layer as the plurality of data lines 2, and the plurality of common electrode lines 3 are parallel to the data lines 2, so that the problem that short circuit which is prone to be occurred on the parallel wirings in a case that the gate lines 1 and the common electrode lines 3 are arranged at a same layer is avoided. Furthermore, in a case that the problem of short circuit or the problem of circuit disconnection of the signal lines on the array substrate are occurred, it is convenient to test and maintain the circuit of the array substrate, so that the yield of the product is improved.

Figure 2:
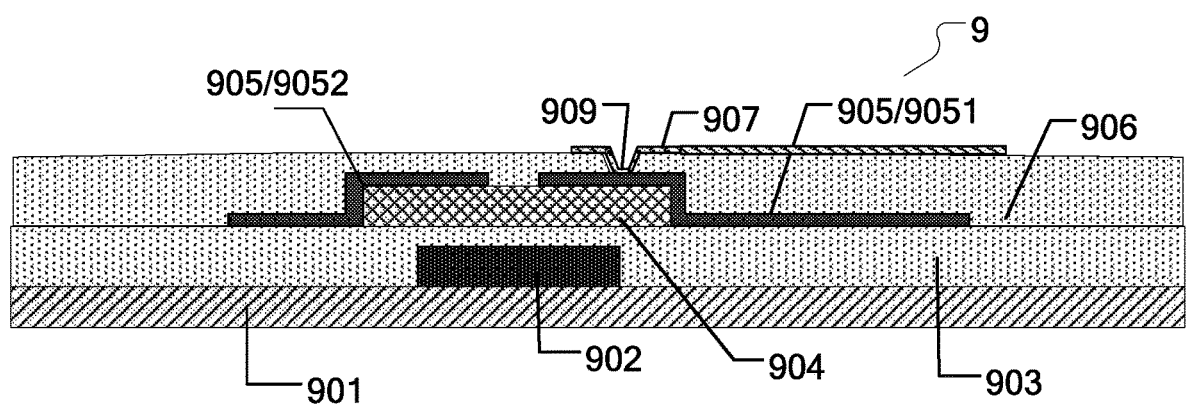
FIG. 2 is a schematic diagram of a partial section structure of an array substrate provided by an embodiment of the present invention.

For example, FIG. 2 is a schematic diagram of a partial section structure of an array substrate provided by an embodiment of the present invention. FIG. 2 illustrates a pixel structure employing a bottom gate type thin film transistor, however, the embodiments of the present invention are not limited to this, for example, the pixel structure may also be a top-gate type thin film transistor.

In the embodiment as illustrated in FIG. 2, a gate electrode layer 902 (including a gate electrode of the thin film transistor and gate lines connected to the gate electrode) is formed on the base substrate 901, a gate insulating layer 903 covers the gate electrode layer 902 and the base substrate 901, a semiconductor layer 904 is formed on the gate insulating layer 903; a source/drain electrode layer 905 is formed on the gate insulating layer 903 and the semiconductor layer 904, a drain electrode 9051 and a source electrode 9052 are spaced apart from each other on the semiconductor layer 904, the data lines and the source electrode 9052 are integrally formed. An insulating layer 906 (or a passivation layer) is formed on the gate insulating layer 903, the semiconductor layer 904, and the source/drain electrode layer 905; a via hole 909 is formed in the insulating layer 906 to expose a portion of the drain electrode 9051, the pixel electrode 907 is formed on the insulating layer 906 and connected to the drain electrode 9051 by the via hole 909.

As illustrated in FIG. 1 and FIG. 2, the plurality of data lines 2 comprise first data lines 21 and second data lines 22 which are arranged in parallel and provided between each pair of adjacent columns of sub-pixel units 908, and in the row direction, the first data lines and the second data lines 22 are alternately arranged. In each pair of the adjacent columns of sub-pixel units 908, the sub-pixel units in odd row are connected to the first data lines, and the sub-pixel units in even row are connected to the second data lines.

The array substrate 9 further comprises a first data bus, a second data bus and a common electrode bus. Each of the sub-pixel units comprises a thin film transistor, a common electrode and a pixel electrode (not shown). In an embodiment of the present invention, for example, with respect to the base substrate 901, the common electrode lines 3 are arranged on the gate lines 1.

For example, the common electrode lines 3 are arranged between two adjacent columns of sub-pixel units, and two adjacent columns of sub-pixel units share a same common electrode line 3 between them.

For example, the array substrate provided by an embodiment of present invention may also comprise a first data bus 4 and a second data bus 5 which are parallel to the gate lines 1, for example, each first data line 21 is connected to the first data bus 4, and each second data line 22 is connected to the second data bus 5. For example, after the first data lines 21 and the second data lines 22 are formed, the first data lines 21 and the second data lines 22 can be scanned one by one by the detection maintenance device.

The first data bus 4 and the second data bus 5 are arranged at different layers or arranged at a same layer, for example, the first data bus 4 is arranged at the gate electrode layer 902 where the gate lines 1 are located, and the second data bus 5 is arranged at the source/drain electrode layer 905 where the data lines 2 are located, in this case, each first data line 21 is electrically connected to the first data bus 4 by the via hole formed in the gate insulating layer 903; or the second data bus 5 is arranged at the gate electrode layer 902 where the gate lines 1 are located, and the first data bus 4 is arranged at the source/drain electrode layer 905 where the data lines 2 are located, in this case, each second data line 22 is electrically connected to the second data bus 5 by the via hole formed in the gate insulating layer 903. In a practical application, the first data bus 4 and the second data bus 5 can also be arranged in other layers, which will not be described in detail herein for simplicity.

For example, the array substrate provided by an embodiment of present invention may also comprise a common electrode bus 6 arranged at a different layer from the common electrode lines 3 and parallel to the gate lines 1, so that the common electrode lines 3 are intersected with the gate lines, and each of the common electrode lines 3 is connected to the common electrode bus 6, for example, the common electrode bus 6 is arranged at the gate electrode layer 902. In a practical application, the common electrode bus 6 may also be arranged at a same layer as the common electrode lines 3, and intersected with the common electrode lines 3.

For example, the array substrate provided by an embodiment of present invention may also comprise a thin film transistor, a common electrode and a pixel electrode disposed in each of the sub-pixel units. In an embodiment of the present invention, a gate electrode of the thin film transistor is connected to the gate lines 1, a source electrode of the thin film transistor is connected to the data line 2, the common electrode is connected to the common electrode line 3, the pixel electrode is connected to a drain electrode of the thin film transistor. The common electrode may be used as a storage electrode, for example, in a direction perpendicular to the base substrate, at least a portion of the common electrode overlaps with at least a portion of the pixel electrode to form a storage capacitor; or the common electrode and the pixel electrode may form an electric field for controlling the deflection of the liquid crystal, for example, for an IPS (In-Plane Switching) type LCD, or an ADS (Advanced Super Dimension Switching) type of LCD.

For example, a semiconductor layer 904 of the thin film transistor is arranged between a layer of the data lines 2 and a layer of the gate lines 1, and the gate electrode of the thin film transistor is formed with the gate lines 1 integrally, and the source electrode of the thin film transistor is formed with the data lines 2 integrally. The semiconductor layer is made of semiconductor material, and the semiconductor material is, for example, amorphous silicon, microcrystalline silicon, polycrystalline silicon, or oxide semiconductor. The oxide semiconductor may be, for example, IGZO (indium gallium zinc oxide), ZnO (Zinc Oxide), or the like. A gate insulating layer 903 is arranged between the semiconductor layer 904 and the layer of the gate lines 1 and the gate electrode of the thin film transistor, the gate insulating layer 903 is used for preventing conduction between the semiconductor layer 904 and the gate lines 1 and the gate electrode of the thin film transistor.

For example, an insulating layer is arranged on the data lines 2, the gate lines 1 and the semiconductor layer, the insulating layer is usually made of an organic insulating material (e.g., acrylic resin), or an inorganic insulating material (e.g., silicon nitride ($SiN_x$), or silica ($SiO_x$)).

For example, the pixel electrode in an embodiment of the present invention may be arranged at a same layer as the gate lines 1, or disposed between the semiconductor layer 904, and the source/drain electrode layer 905 where the data lines 2 are located, or disposed between the source/drain electrode layer 905 where the data lines 2 are located, and the insulating layer 906, or disposed on the insulating layer 906. In a case that the pixel electrode 907 is disposed on the insulating layer 906 (as illustrated in FIG. 2), the insulating layer 906 is provided with a via hole 909, the pixel electrode 907 is connected to the drain electrode 9051 of the source/drain electrode layer 905 where the data lines 2 and the common electrode lines 3 are located by the via hole 909.

For example, in an embodiment of the present invention, the array substrate may also comprise a plurality of gate drivers 7, for example, GOA (Gate-driver on Array) units, and the plurality of gate drivers 7 are arranged at one end or both ends of each of the gate lines 1. As illustrated in FIG. 1, the plurality of gate drivers 7 are arranged at both ends of each of the gate lines 1 in an alignment manner, and the gate drivers 7 arranged at one end of each of the gate lines 1 are connected to each other, and control signals are input to the gate drivers 7 by a signal input terminal 8 disposed at one end of a gate drive 7.

In an practical application, both ends of each of the gate lines 1 is provided with a gate drive 7 to avoid the gate lines 1 being too long to avoid the signal applied by the gate driver 7 is impeded or delayed on the gate lines 1.

For example, in an embodiment of the present invention, the base substrate 901 may be a glass substrate or a plastic substrate.

For example, in an embodiment of the present invention, after the gate lines 1, the data lines 2, and the common electrode lines 3 are formed, the data lines 2 and the common electrode lines 3 can be tested by an open circuit detector. After testing, the first data bus 4, the second data bus 5, and the common electrode bus 6 may be removed from the array substrate 9 by a cutting process.

Figure 3:
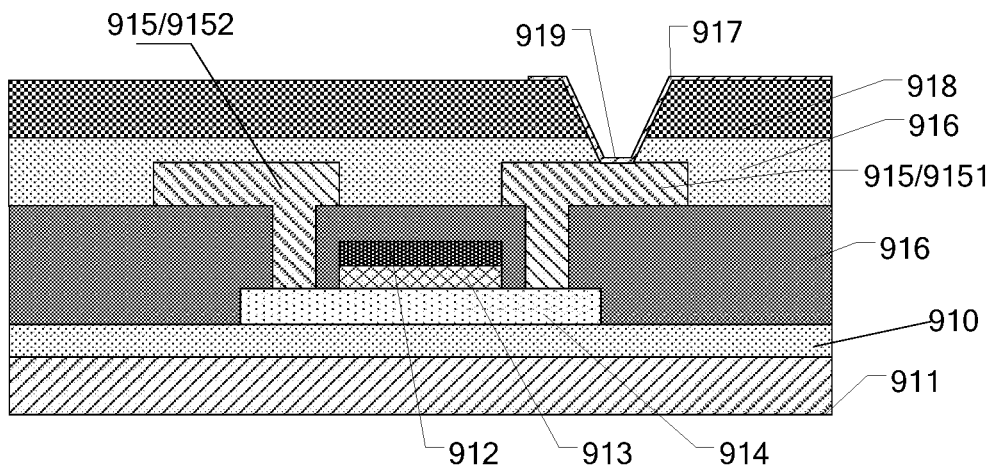
FIG. 3 is a schematic diagram of a partial section structure of another array substrate provided by an embodiment of the present invention.

For example, FIG. 3 is a schematic diagram of a partial section structure of another array substrate provided by an embodiment of the present invention, as illustrated in FIG. 3, the thin film transistor in the array substrate is a top-gate type thin film transistor.

For example, as illustrated in FIG. 3, a buffer layer 910 is disposed on the base substrate 911, a semiconductor layer 914 is disposed on the buffer layer 910, a gate insulating layer 913, a gate electrode layer 912, and an insulating layer 916 are successively formed on the semiconductor layer 914, a source/drain electrode layer 915 is formed on the insulating layer 916, the insulating layer 916 and a passivation layer 918 are sequentially formed on the source/drain electrode layer 915, a via hole 919 is formed in the passivation layer 918 and the insulating layer 916, the pixel electrode 917 is electrically connected with the drain electrode 9151 of the source/drain electrode layer 915 by the via hole 919. Similarly, the gate electrode of the thin film transistor is connected with the gate line, and the source electrode 9152 is connected with the data line.

For example, other structure features of the array substrate in the embodiment of the present invention, for example, the gate lines 1, the data lines 2, the common electrode lines 3, and semiconductor layer 904 can refer to the relevant descriptions, and their technical effects and principles are similar, which will not be described in detail herein for simplicity.

An embodiment of the present invention also provides a display panel, and the display panel comprises any one of the above mentioned array substrate. The display panel may be a liquid crystal display panel, and may also be an OLED (organic light emitting diode) display panel, an electronic paper display panel, or the like.

For example, the display panel provided by an embodiment of the present invention may also comprise an opposing substrate opposite to the array substrate, the display panel is formed by cell-assembling the array substrate and the opposite substrate, and a liquid crystal is filled in the cavity of the cell formed by the array substrate and the opposite substrate. The opposing substrate, for example, is a color filter substrate, and the opposing substrate may comprise an opposing base substrate, a black matrix, and a color filter unit.

An embodiment of the present invention also provides a display device, and the display device comprises any one of the above mentioned display panel. For instance, the display device may be: a liquid crystal display panel, an electronic paper, an organic light-emitting diode (short for OLED) panel, a mobile phone, a tablet computer, a television, a display, a notebook computer, a digital camera, a navigation system, any other product or component having a display function.

Figure 4:
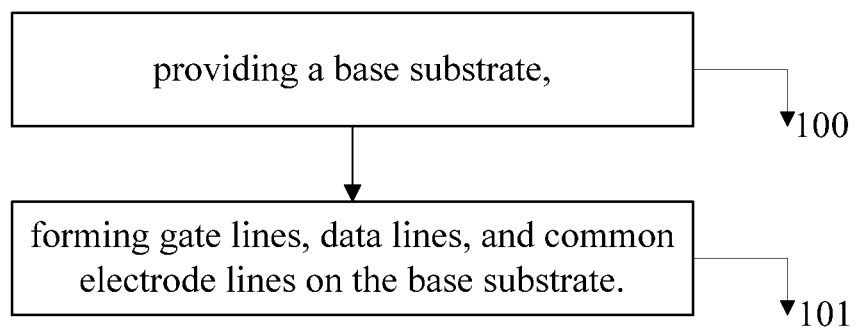
FIG. 4 is a flow diagram of a manufacturing method of an array substrate provided by an embodiment of the present invention.

An embodiment of the present invention also provides a manufacturing method of an array substrate. FIG. 4 is a flow diagram of a manufacturing method of an array substrate provided by an embodiment of the present invention. As illustrated in FIG. 4, the manufacturing method of the array substrate comprises following steps.

Step 100: providing a base substrate;

Step 101: forming gate lines, data lines, and common electrode lines on the base substrate.

For example, the common electrode lines and the gate lines are arranged at different layers; the common electrode lines and the data lines are arranged at a same layer and the common electrode lines are parallel to the data lines; the gate lines are insulated from and intersected with the data lines and the common electrode lines to define a plurality of sub-pixel units.

For example, because the common electrode lines and the gate lines are arranged at different layers, the common electrode lines are arranged at a same layer as the data lines, the common electrode lines are parallel to the data lines, and the gate lines are insulated from and intersected with the data lines and the common electrode lines to define a plurality of sub-pixel units, it is favorable for detecting whether the array substrate is in a state of short circuit, or open circuit, so that the yield of the product is improved.

Figure 5:
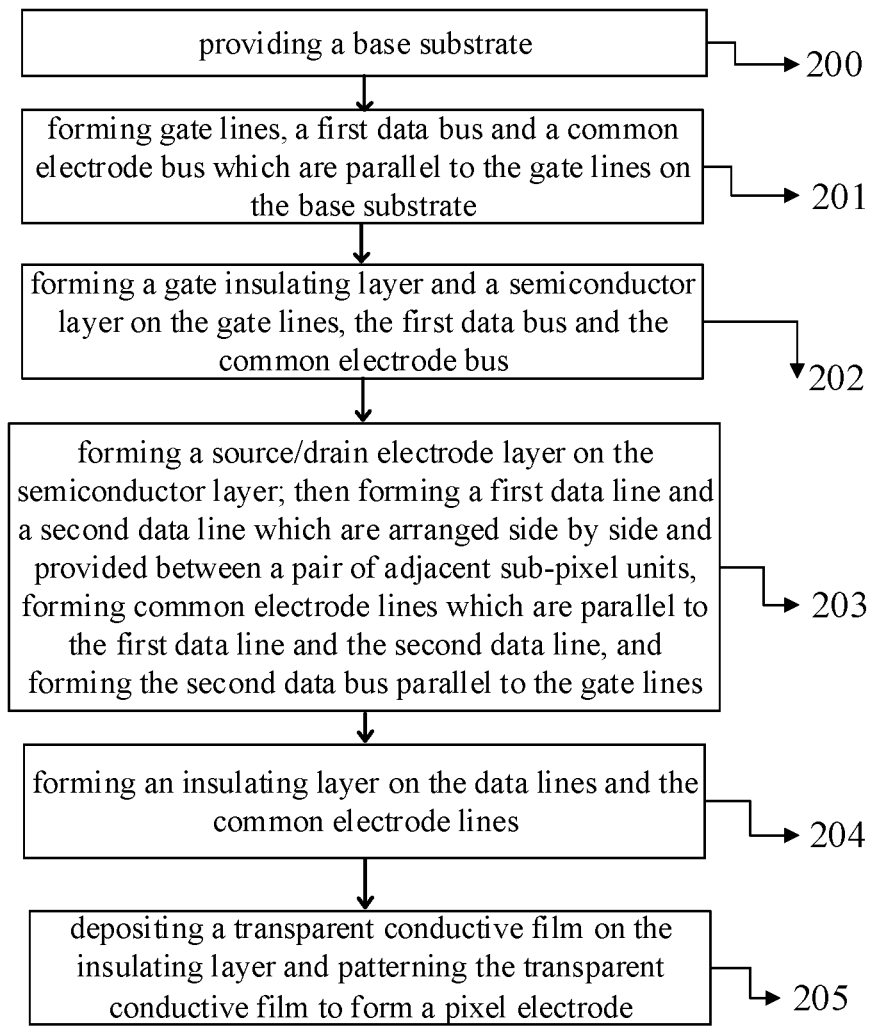
FIG. 5 is a process diagram of a manufacturing method of an array substrate provided by an embodiment of the present invention.

For example, FIG. 5 is a process diagram of a manufacturing method of an array substrate provided by an embodiment of the present invention. As illustrated in FIG. 5, the manufacturing method of the array substrate comprises following steps:

Step 200: providing a base substrate.

For example, the base substrate may be a glass substrate, or a plastic substrate.

Step 201: forming gate lines, a first data bus and a common electrode bus which are parallel to the gate lines on the base substrate.

For example, a metal film is deposited uniformly on the whole base substrate, the gate lines, the first data bus, and the common electrode bus are formed by a patterning process. The patterning process comprises: coating a layer of photoresist on the metal film, then exposing, developing, etching, stripping off the photoresist, etc., to form the gate lines, the first data bus, and the common electrode bus, which are parallel to the gate lines.

For example, the metal film may be made of metal material, such as aluminum, aluminum alloy, copper, or copper alloy.

Step 202: forming a gate insulating layer, and a semiconductor layer on the gate lines, the first data bus, and the common electrode bus.

For example, the semiconductor layer may be made of indium gallium oxide (IGZO), indium zinc oxide (IZO), Zinc Oxide (ZnO), gallium zinc oxide (GZO), or other metal oxides.

In the operation, a via hole may also be formed in the gate insulating layer by a patterning process to expose a portion of the first data bus and a portion of the common electrode bus.

Step 203: forming a source/drain electrode layer on the semiconductor layer; forming first data lines and second data lines which are arranged in parallel and provided between each pair of adjacent columns of sub-pixel units, forming common electrode lines which are parallel to the first data lines and the second data lines, and forming a second data bus parallel to the gate lines. The gate lines are insulated from and intersected with the data lines and the common electrode lines to define a plurality of sub-pixel units.

In each pair of the adjacent columns of sub-pixel units, the sub-pixel units in odd row are connected to the first data lines, and the sub-pixel units in even row are connected to the second data lines. Each first data line is connected to the first data bus by the via hole formed in the gate insulating layer, each second data line is connected to the second data bus, and each common electrode line is connected to the common electrode bus by the via holes formed in the gate insulating layer.

For example, a metal film is evaporated on the semiconductor layer, with reference to Step 202, similarly, an electrode pattern comprising first data lines and second data lines, common electrode lines, and a second data bus is formed by patterning process. Or example, the metal film may be made of metal material, such as aluminum, aluminum alloy, copper, or copper alloy.

Step 204: forming an insulating layer on the data lines and the common electrode lines.

For example, a layer of an insulating material is evaporated on the whole source/drain electrode layer, and the insulating material comprises inorganic insulating material, such as silicon nitride ($SiN_x$), silicon oxide ($SiO_x$), or silicon nitrogen oxide ($SiO_xN_y$), or organic insulating material.

In the operation, a via hole can also be formed in the insulating layer to expose a portion of the drain electrode.

Step 205: depositing a transparent conductive film on the insulating layer and patterning the transparent conductive film to form a pixel electrode.

For example, a layer of indium tin oxide (ITO) film is deposited on the insulating layer, and then a pixel electrode is formed by a patterning process. The pixel electrode is electrically connected with the drain electrode through the via hole ill the insulating layer.

In an instance of manufacturing an IPS type array substrate, in each of the sub-pixel units, the pixel electrode and the common electrode are formed in a same layer, for example, both the pixel electrode and the common electrode are comb electrodes. In the step 204, a via hole may also be formed in the insulating layer to expose a portion of the common electrode line by a patterning process. In the step 205, a common electrode is formed at the same time as the pixel electrode, and the common electrode is electrically connected with the common electrode line through the via hole in the insulating layer.

In all embodiment of the present invention, a thin film transistor, a common electrode, and a pixel electrode are formed ill each of the sub-pixel units. A gate electrode of the thin film transistor is connected to the gate line, a source electrode of thin film transistor is connected to the data line, the common electrode is connected to the common electrode line, and the pixel electrode is connected to a drain electrode of the thin film transistor.

Embodiments of the present invention provide an array substrate and a manufacturing method thereof; a display panel and a display device, which have at least one of the following advantages:

(1) In the array substrate, the common electrode lines and the gate lines are arranged at different layers, the common electrode lines are arranged at a same layer as the data lines, and the common electrode lines are parallel to the data lines, so that the problem that parallel wirings are prone to be short circuit is avoided.

(2) It is convenient to test and maintain the circuit of the array substrate, and the detection capability of the device is enhanced;

(3) The yield of the product is improved to maximize the profit.

The following points need to be explained:

(1) The accompanying drawings in the embodiments of the present disclosure only involve structures relevant to the embodiments of the present disclosure, and other structures may refer to the common design.

(2) For clarity, in the accompanying drawings of the embodiments of the present disclosure, the thickness of layers or regions is enlarged or reduced. That is, the accompanying drawings are not drawn according to actual scales. It should be understood that: in an instance that an element, such as a layer, a film, a region, or a substrate is referred to as being disposed "on" or "under" another element, the element may be "directly" disposed "on" or "under" another element, or an intermediate element may be provided.

(3) Without any conflict, the embodiments of the present invention and the features in the embodiments can be combined with each other to obtain new embodiments.

The described above are only specific embodiments of the present disclosure, and the present disclosure is not limited thereto. The scope of the present disclosure is defined by the claims.

The application claims priority of Chinese Patent Application No. 201610802113.2, filed on Sep. 5, 2016, the invention of which is incorporated herein by reference in its entirety as part of the present application.

What is claimed is:

1. An array substrate, comprising:
  a base substrate;
  a gate electrode, a gate insulating layer on the gate electrode, a plurality of gate lines, a plurality of data lines comprising first data lines and second data lines, and a plurality of common electrode lines which are provided on the gate insulating layer;

a first data bus and a second data bus which are parallel to the plurality of gate lines, wherein each of the first data lines is connected to the first data bus by a first via hole formed in the gate insulating layer, each of the second data lines is connected to the second data bus by a second via hole formed in the gate insulating layer, and the first data bus and the second data bus are arranged at different layers; and a common electrode bus provided in a different layer from a layer where the plurality of common electrode lines are located and parallel to the plurality of gate lines, each of the common electrode lines being connected with the common electrode bus by a third via hole formed in an insulating layer;

wherein the plurality of common electrode lines and the plurality of gate lines are arranged in different layers;

the plurality of common electrode lines and the plurality of data lines are arranged at a same layer and are parallel to each other; and the plurality of gate lines are insulated from and intersected with the plurality of data lines and the plurality of common electrode lines to define a plurality of sub-pixel units.

2. The array substrate according to claim 1, wherein the first data lines and the second data lines are arranged in parallel between each pair of adjacent columns of sub-pixel units, in each pair of the adjacent columns of sub-pixel units, the sub-pixel units in each odd row are connected to the first data lines, and the sub-pixel units in each even row are connected to the second data lines.

3. The array substrate according to claim 1, wherein the plurality of common electrode lines are arranged on the gate lines or under the gate lines.

4. The array substrate according to claim 3, further comprising a thin film transistor, a common electrode and a pixel electrode provided in each of the sub-pixel units, wherein a gate electrode of the thin film transistor is connected to one of the gate lines, a source electrode of the thin film transistor is connected to one of the data lines, the common electrode is connected to one of the common electrode lines, and the pixel electrode is connected to a drain electrode of the thin film transistor.

5. The array substrate according to claim 4, wherein a semiconductor layer of the thin film transistor is arranged between a layer of the data lines and a layer of the gate lines, and a gate insulating layer is arranged between the semiconductor layer and the layer of the gate lines.

6. The array substrate according to claim 5, wherein the insulating layer is arranged on the layer of the data lines, the layer of the gate lines and the semiconductor layer.

7. The array substrate according to claim 6, further comprising a plurality of gate drivers, wherein the plurality of gate drivers are arranged at both ends of each of the gate lines.

8. A display panel, comprising an array substrate, wherein the array substrate comprises:

a base substrate;

a gate electrode, a gate insulating layer on the gate electrode, a plurality of gate lines, a plurality of data lines comprising first data lines and second data lines, a passivation layer and a plurality of common electrode lines which are provided on the gate insulating layer;

a first data bus and a second data bus which are parallel to the plurality of gate lines, wherein each of the first data lines is connected to the first data bus by a first via hole formed in the gate insulating layer, each of the second data lines is connected to the second data bus by a second via hole formed in the gate insulating layer, and the first data bus and the second data bus are arranged in different layers; and a common electrode bus provided in a different layer from a layer where the plurality of common electrode lines are located and parallel to the plurality of gate lines, each of the common electrode lines being connected with the common electrode bus by a third via hole formed in the passivation layer;

wherein the plurality of common electrode lines and the plurality of gate lines are arranged in different layers;

the plurality of common electrode lines and the plurality of data lines are arranged in a same layer and are parallel to each other; and the plurality of gate lines are insulated from and intersected with the plurality of data lines and the plurality of common electrode lines to define a plurality of sub-pixel units.

9. A display device, comprising the display panel according to claim 8.

10. A manufacturing method of an array substrate, comprising:

providing a base substrate;

forming a gate electrode, a gate insulating layer on the gate electrode, gate lines, data lines comprising first data lines and second data lines, a passivation layer and common electrode lines on the gate insulating layer;

forming a first data bus and a second data bus in different layers, wherein each of the first data lines is connected to the first data bus by a first via hole formed in the insulating layer, each of the second data lines is connected to the second data bus by a second via hole formed in the gate insulating layer, and both the first data bus and the second data bus are parallel to the gate lines; and forming a common electrode bus in a different layer from a layer where the plurality of common electrode lines are located and parallel to the gate lines, to allow each of the common electrode lines to be connected with the common electrode bus by a third via hole formed in the passivation layer;

wherein the plurality of common electrode lines and the gate lines are formed in different layers;

the plurality of common electrode lines and the data lines are formed in a same layer and are parallel to each other; and the gate lines are insulated from and intersected with the data lines and the common electrode lines to define a plurality of sub-pixel units.

11. The manufacturing method according to claim 10, wherein the data lines comprise first data lines and second data lines which are arranged in parallel between each pair of adjacent columns of sub-pixel units, in each pair of the adjacent columns of sub-pixel units, the sub-pixel units in each odd row are connected to the first data lines, and the sub-pixel units in each even row are connected to the second data lines.

12. The manufacturing method according to claim 10, wherein the plurality of common electrode lines are arranged on the gate lines and under the gate lines.

13. The manufacturing method according to claim 10, further comprising forming a thin film transistor, a common electrode, and a pixel electrode in each of the sub-pixel units, wherein a gate electrode of the thin film transistor is connected to one of the gate lines, a source electrode of the thin film transistor is connected to one of the data lines, the common electrode is connected to one of the common electrode lines, and the pixel electrode is connected to a drain electrode of the thin film transistor.

14. The manufacturing method according to claim 10, further comprising forming a semiconductor layer of the thin film transistor between a layer of the data lines and a layer of the gate lines, and forming a gate insulating layer between the semiconductor layer and the layer of the gate lines.

\* \* \* \* \*